United States Patent
Chang et al.

(10) Patent No.: US 7,491,998 B2
(45) Date of Patent: Feb. 17, 2009

(54) ONE TIME PROGRAMMABLE MEMORY AND THE MANUFACTURING METHOD THEREOF

(75) Inventors: Ko-Hsing Chang, Hsinchu (TW); Tsung-Cheng Huang, Hsinchu (TW); Yan-Hung Huang, Hsinchu County (TW)

(73) Assignee: Powerchip Semiconductor Corp., Hsinchu (TW)

( * ) Notice: Subject to any disclaimer, the term of this patent is extended or adjusted under 35 U.S.C. 154(b) by 257 days.

(21) Appl. No.: 11/536,693

(22) Filed: Sep. 29, 2006

(65) Prior Publication Data
US 2007/0221980 A1 Sep. 27, 2007

(30) Foreign Application Priority Data
Mar. 24, 2006 (TW) .................................. 95110241

(51) Int. Cl.
*H01L 29/76* (2006.01)
(52) U.S. Cl. .......... 257/314; 257/E21.68; 257/E27.103; 438/259
(58) Field of Classification Search ................. 257/314, 257/E21.68, E27.103; 438/259
See application file for complete search history.

(56) References Cited

U.S. PATENT DOCUMENTS

| 6,678,190 B2 | 1/2004 | Yang et al. |
| 7,209,392 B2 * | 4/2007 | Chen et al. ............. 365/185.26 |
| 2005/0247973 A1 * | 11/2005 | Lee ............................ 257/325 |
| 2006/0244036 A1 * | 11/2006 | Wu ............................. 257/314 |
| 2006/0244041 A1 * | 11/2006 | Tanaka et al. ................ 257/315 |

* cited by examiner

*Primary Examiner*—Trung Dang
(74) *Attorney, Agent, or Firm*—Jianq Chyun IP Office (57) ABSTRACT

A one time programmable memory including a substrate, a plurality of isolation structures, a first transistor, and a second transistor is provided. The isolation structures are disposed in the substrate for defining an active area. A recess is formed on each of the isolation structures so that the top surface of the isolation structure is lower than that of the substrate. The first transistor is disposed on the active area of the substrate and is extended to the sidewall of the recess. The gate of the first transistor is a select gate. The second transistor is disposed on the active area of the substrate and is connected to the first transistor in series. The gate of the second transistor is a floating gate which is disposed across the substrate between the isolation structures in blocks and is extended to the sidewall of the recess.

20 Claims, 7 Drawing Sheets

ONE TIME PROGRAMMABLE MEMORY AND THE MANUFACTURING METHOD THEREOF

CROSS-REFERENCE TO RELATED APPLICATION

This application claims the priority benefit of Taiwan application serial no. 95110241, filed on Mar. 24, 2006. All disclosure of the Taiwan application is incorporated herein by reference.

BACKGROUND OF THE INVENTION

1. Field of the Invention

The present invention relates to a non-volatile memory and the manufacturing method thereof. More particularly, the present invention relates to a one time programmable memory and the manufacturing method thereof.

2. Description of Related Art

Non-volatile memories can be classified into mask ROM, erasable programmable ROM (EPROM), electrically erasable programmable ROM ($E^2$PROM), one time programmable ROM (OTPROM) etc. based on the data writing manners thereof.

The U.S. Pat. No. 6,678,190 discloses a one time programmable read-only memory, wherein two P-type transistors disposed on N-well and connected in series are respectively used as the select gate and the floating gate. This invention can be integrated with CMOS fabricating process since no control gate is required.

However, faster and smaller products have been developed along with the development of the IC industry; thus, the integration of semiconductor devices has to be increased continuously. The decrease in line width will result in too small channel current in the memory, accordingly, data misjudgment is easily induced and the reliability of the memory is reduced.

In addition, misalignment can be easily induced in etching process of contact window opening due to the increase in the integration of the devices, so that the contact window opening may be etched to the isolation structure besides the doped region, which may result in PN junction between the P-type doped region and the N-well and further the problem of current leakage.

To avoid the aforementioned PN junction problem, a silicon nitride layer is usually formed on the isolation structures for preventing over-etching. However, a part of the charges stored in the floating gate may diffuse into the silicon nitride layer due to the charge trapping characteristic of silicon nitride, which may result in too small channel current and may reduce the operation efficiency of the memory.

SUMMARY OF THE INVENTION

Accordingly, the present invention is directed to a one time programmable memory, wherein the widths of the channels under the select gate and the floating gate and the channel currents are increased.

According to another aspect of the present invention, a manufacturing method of a one time programmable memory is provided, wherein a one time programmable memory with larger channel current can be produced with simple process.

The present invention provides a one time programmable memory including a substrate, a plurality of isolation structures, a first transistor, and a second transistor. The isolation structures are disposed in the substrate for defining an active area. A recess is formed on each of the isolation structures so that the top surface of the isolation structure is lower than that of the substrate. The first transistor is disposed on the active area of the substrate and extended to the sidewall of the recess, and the gate of the first transistor serves as a select gate. The second transistor is disposed on the active area of the substrate and is connected to the first transistor in series. The gate of the second transistor serves as a floating gate and is disposed across the substrate of the active area in blocks and is extended to the sidewall of the recess.

The foregoing one time programmable memory further includes a gate dielectric layer disposed between the floating gate and the substrate. In addition, a select gate dielectric layer is disposed between the select gate and the substrate.

In the foregoing one time programmable memory, the first transistor and the second transistor are P-type transistors.

The foregoing one time programmable memory further includes a mask layer disposed between the isolation structures and the floating gate. Wherein the material of the mask layer is, for example, silicon nitride.

In the foregoing one time programmable memory, the material of the floating gate includes doped polysilicon.

In the foregoing one time programmable memory, a recess is disposed on each of the isolation structures so that the select gate and the floating gate can be extended to the sidewall of the recess, accordingly, the width of the channel area and the current can be increased without increasing the size of the floating gate.

The present invention further provides a one time programmable memory including a plurality of isolation structures, a plurality of memory cells, a plurality of select gate lines, a plurality of source lines, and a plurality of bit lines. The isolation structures are disposed in the substrate, and a recess is formed on each of the isolation structures so that the top surface of the isolation structure is lower than that of the substrate. The memory cells are arranged in rows and columns and are disposed on the substrate. Each memory cell includes a first transistor and a second transistor. The gate of the first transistor serves as a select gate and is extended to the sidewall of the recess. The gate of the second transistor serves as a floating gate and is disposed across the substrate between the isolation structures in blocks and is extended to the sidewall of the recess. Wherein, the second terminal (the drain) of the first transistor is connected to the first terminal (the source) of the second transistor in series. The select gate lines are disposed across the isolation structures and the substrate, and each select gate line is connected to the gate of a first transistor in the same row. The source lines are respectively coupled to the first terminals (the sources) of the first transistors in the same row. The bit lines are respectively coupled to the second terminals (the drains) of the second transistors in the same column.

The foregoing one time programmable memory further includes a gate dielectric layer disposed between the floating gate and the substrate. A select gate dielectric layer is disposed between the select gate and the substrate.

In the foregoing one time programmable memory, two adjacent memory cells are disposed in a mirror symmetric arrangement.

In the foregoing one time programmable memory, the first transistors and the second transistors are P-type transistors.

The foregoing one time programmable memory further includes a mask layer disposed between the isolation structures and the floating gates. Wherein the material of the mask layer includes, for example, silicon nitride.

In the foregoing one time programmable memory, a recess is disposed on each of the isolation structures so that the select gate and the floating gate can be extended to the sidewall of the recess. Accordingly, the channel width and the memory current can be increased without increasing the size of the floating gate. Thus, the operation efficiency may be unaffected due to small current even though the mask layer may trap some charges.

The present invention provides a manufacturing method of a one time programmable memory. According to this method, first a substrate with a plurality of isolation structures disposed therein is provided. Then, a portion of each of the isolation structures is removed to form a recess on the isolation structure. Next, a gate dielectric layer and a conductive material layer, which is extended into the recess, are formed on the substrate. After that, the conductive material layer is patterned to form a plurality of floating gates and a plurality of select gates. Wherein, each of the floating gates is disposed across the substrate between the isolation structures in blocks and is extended to the sidewall of the recess. Each of the select gates is disposed across the sidewalls of the recesses on the isolation structures and the substrate in strips. Next, a plurality of doped regions is formed in the substrate with the floating gates and the select gates as the mask.

In the foregoing manufacturing method of a one time programmable memory, the method for forming recesses on the isolation structures includes, for example, wet or dry etching.

The foregoing manufacturing method of a one time programmable memory further includes forming a mask layer on the substrate after forming the doped regions. The material of the mask layer includes, for example, silicon nitride.

In the foregoing manufacturing method of a one time programmable memory, the method for forming the floating gates includes, for example, first forming a patterned photoresist layer, which exposes portions of the conductive material layer located on the isolation structures on the conductive material layer, then removing the exposed conductive layer, and removing the patterned photoresist layer.

In the foregoing manufacturing method of a one time programmable memory, the doped regions are P-type doped regions.

According to the present invention, recesses are formed on the isolation structures by using a simple fabricating process so that the select gates and the floating gates can be extended to the sidewalls of the recesses, thus, the widths of the channel areas under the floating gates can be increased, and accordingly, the channel currents can be increased.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 2A~2C are cross-sectional views illustrating the manufacturing process in direction Y by cutting FIG. 1B along line I-I'.

DESCRIPTION OF EMBODIMENTS

Figure 1A:
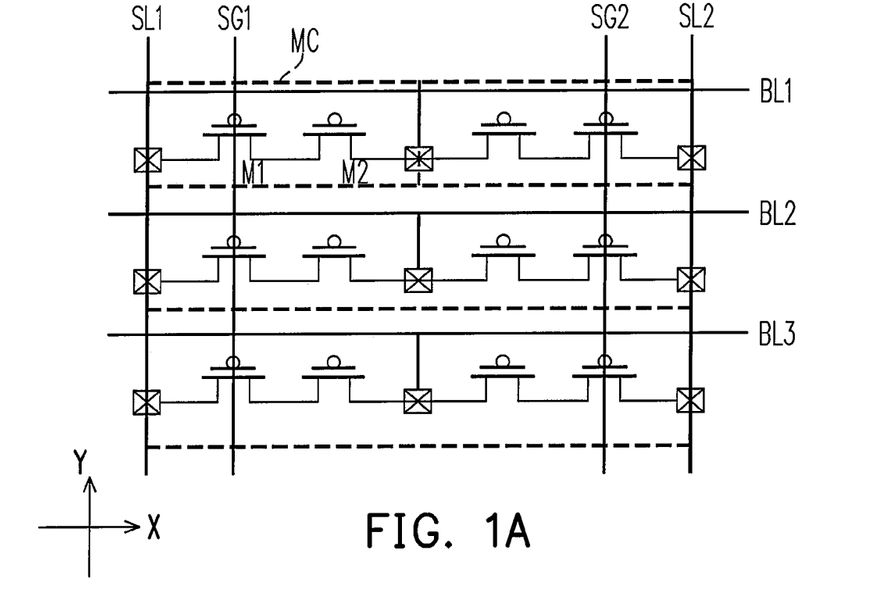
FIG. 1A is a circuit diagram of a one time programmable memory according to an embodiment of the present invention.
Figure 1B:
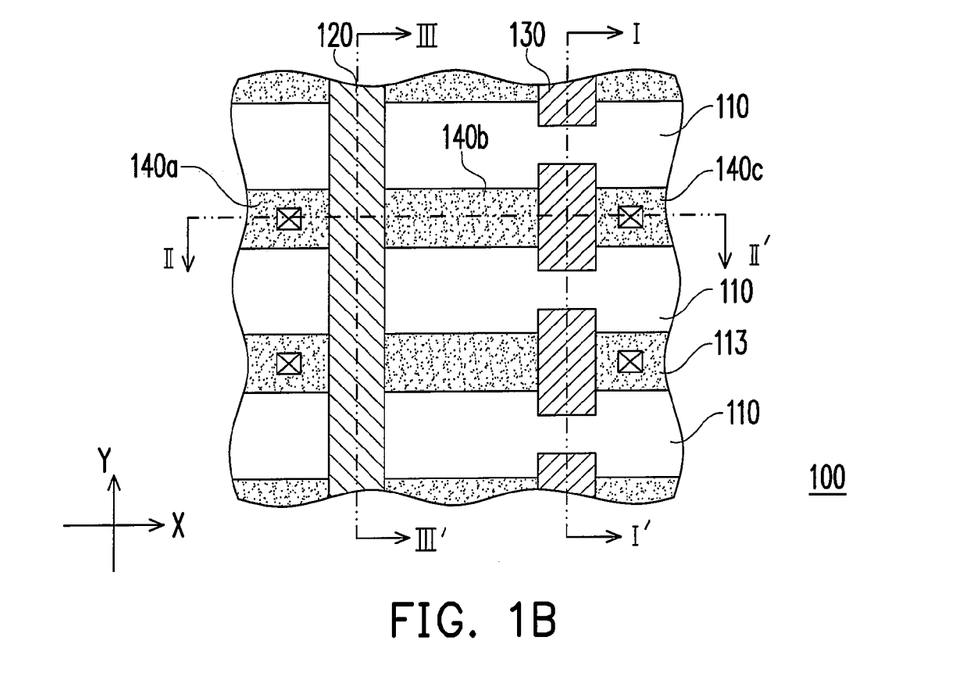
FIG. 1B is a top view of a one time programmable memory according to an embodiment of the present invention.
Figure 1C:
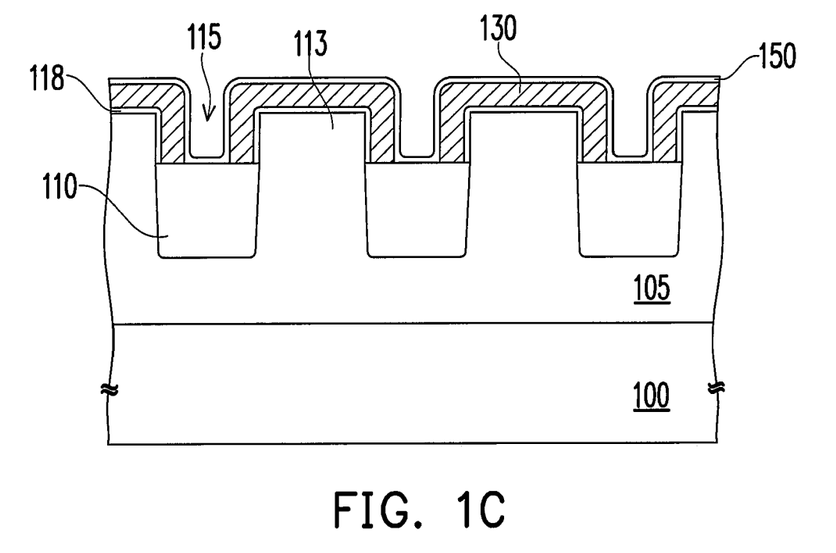
FIG. 1C is a cross-sectional view of FIG. 1B cut along line I-I'.
Figure 1D:
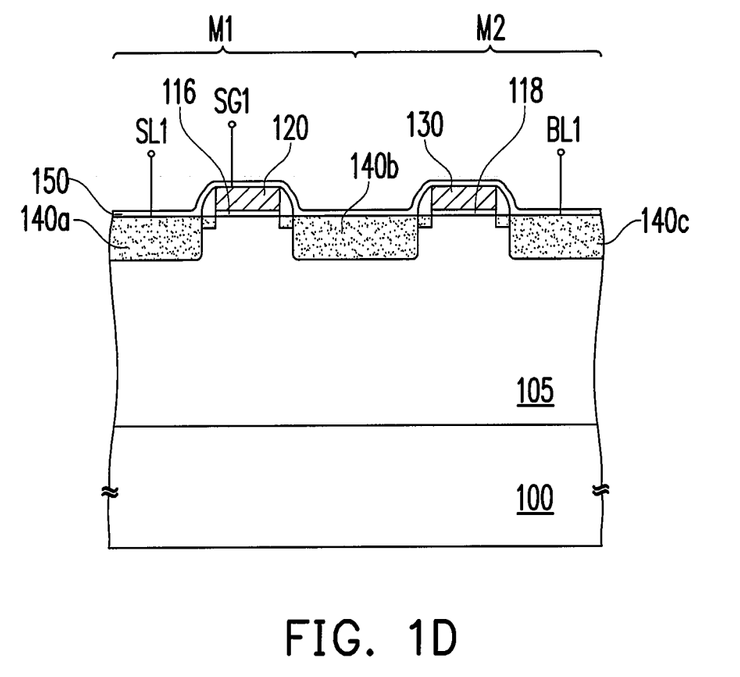
FIG. 1D is a cross-sectional view of FIG. 1B cut along line II-II'.
Figure 1E:
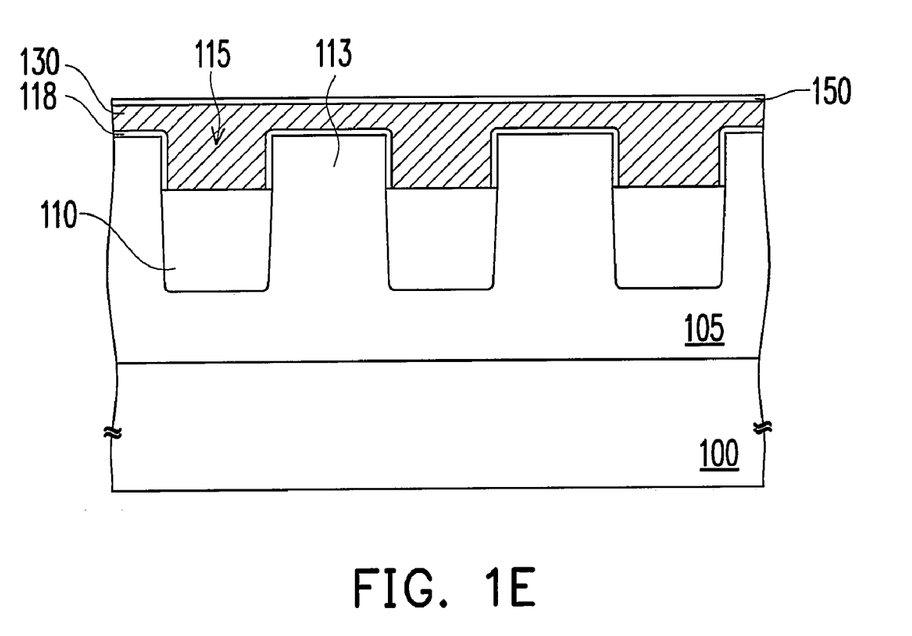
FIG. 1E is a cross-sectional view of FIG. 1B cut along line III-III'.

FIG. 1A is a circuit diagram of a one time programmable memory according to an embodiment of the present invention. FIG. 1B is a top view of a one time programmable memory according to an embodiment of the present invention. FIG. 1C is a cross-sectional view of FIG. 1B cut along line I-I'. FIG. 1D is a cross-sectional view of FIG. 1B cut along line II-II'. FIG. 1E is a cross-sectional view of FIG. 1B cut along line III-III'.

Referring to FIG. 1A, FIG. 1B, FIG. 1C, FIG. 1D, and FIG. 1E, the one time programmable memory in the present invention includes a substrate 100, a plurality of isolation structures 110, a plurality of memory cells MC, select gate lines SG1 and SG2, source lines SL1 and SL2, and bit lines BL1, BL2, and BL3.

The substrate 100 includes, for example, a silicon substrate. The isolation structures 110 are disposed in parallel in the substrate 100 and are extended along the direction X. The isolation structures 110 define an active area 113. A recess 115 is formed on each of the isolation structures 110 so that the top surface of the isolation structure 110 is lower than that of the substrate 100 such that a portion of the sidewall of the substrate 100 of the active area 113 is exposed.

The memory cells MC are arranged in rows and columns and are disposed on the substrate 100. Each of the memory cells MC is disposed on the N-well 105, which is, for example, formed by the transistor M1 and the transistor M2 connected in series, of the substrate 100. The drain of the transistor M1 is connected to the source of the transistor M2, that is, the transistor M1 and the transistor M2 share a doped region 140b. The source of the transistor M1 (the doped region 140a), the drain of the transistor M2 (the doped region 140c), and the doped region 140b are, for example, P-type doped regions with boron dopant.

The gate 120 of the transistor M1 serves as a select gate, and the gate 130 of the transistor M2 serves as a floating gate. The select gate (the gate 120) is, for example, disposed across the isolation structures 110 and the substrate 100 in strips and is extended to the sidewall of the recess 115. The floating gate (the gate 130) is, for example, disposed across the substrate 100 between the isolation structures 110 in blocks and is extended to the sidewall of the recess 115. The material of the gate 120 and the gate 130 includes, for example, doped polysilicon. A select gate dielectric layer 116 is disposed between the gate 120 and the substrate 100, and a gate dielectric layer 118 is disposed between the gate 130 and the substrate 100. The material of the select gate dielectric layer 116 and the gate dielectric layer 118 includes, for example, silicon oxide.

Referring to FIG. 1C and FIG. 1D, a mask layer 150 is further disposed on the substrate 100. The mask layer 150 covers, for example, the transistor M1, the transistor M2, and the isolation structures 110. The material of the mask layer 150 includes, for example, silicon nitride.

Moreover, referring to FIG. 1A, two adjacent memory cells MC are disposed, for example, in a mirror symmetric arrangement.

Referring to FIG. 1A and FIG. 1B again, the select gate lines SG1 and SG2 are, for example, disposed on the substrate across the isolation structures 110 and extended along the direction Y. The select gate lines SG1 and SG2 are connected to the gate 120 of the transistor M1 in the same row (in direction Y).

The source lines SL1 and SL2 are, for example, disposed on the substrate 100 and extended along the direction Y. The source lines SL1 and SL2 are respectively coupled to the source (the doped region 140a) of the transistor M1 in the same row (in direction Y).

The bit lines BL1, BL2, and BL3 are, for example, disposed on the substrate 100 and extended along the direction X. The bit lines BL1, BL2, and BL3 are respectively coupled to the drain (the doped region 140c) of the transistor M2 in the same column (in direction X).

In the foregoing one time programmable memory, since the recesses 115 are disposed on the isolation structures 110, the select gates (the gates 120) and the floating gates (the gates 130) can be extended to the sidewalls of the recesses 115, and the widths of the channel areas and the currents can be increased without increasing the size of the floating gates, accordingly the number of changes injected into the floating gates can be effectively increased.

Meanwhile, since the number of charges injected into the floating gates is increased, thus, even with the mask layer 150 disposed on the isolation structures 110, the operation efficiency of the memory cells may be unaffected by the charge trapping effect produced by the mask layer 150 (for example, silicon nitride). Thus, the mask layer 150 can still be disposed for preventing current leakage induced by the contact between the P-type doped region (140a or 140c) and the N-well 105 due to etching error of the contact window.

Figure 2A:
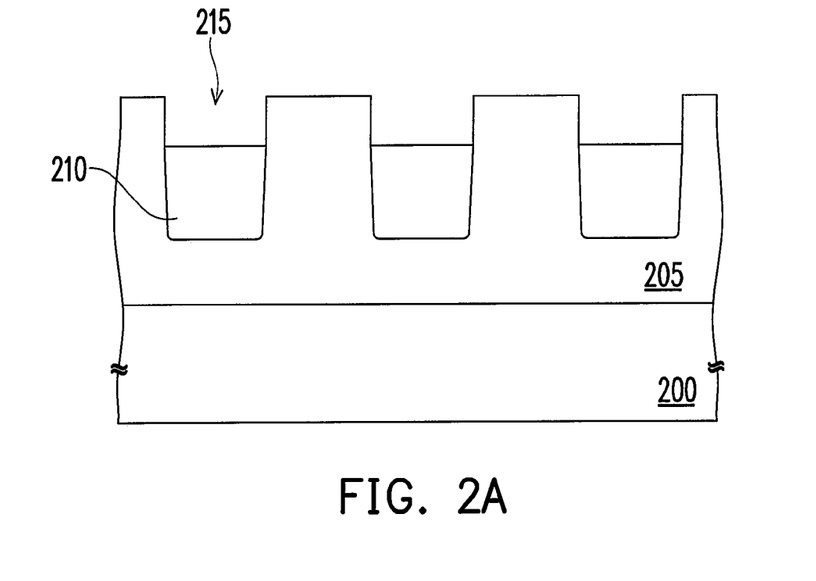
Figure 2B:
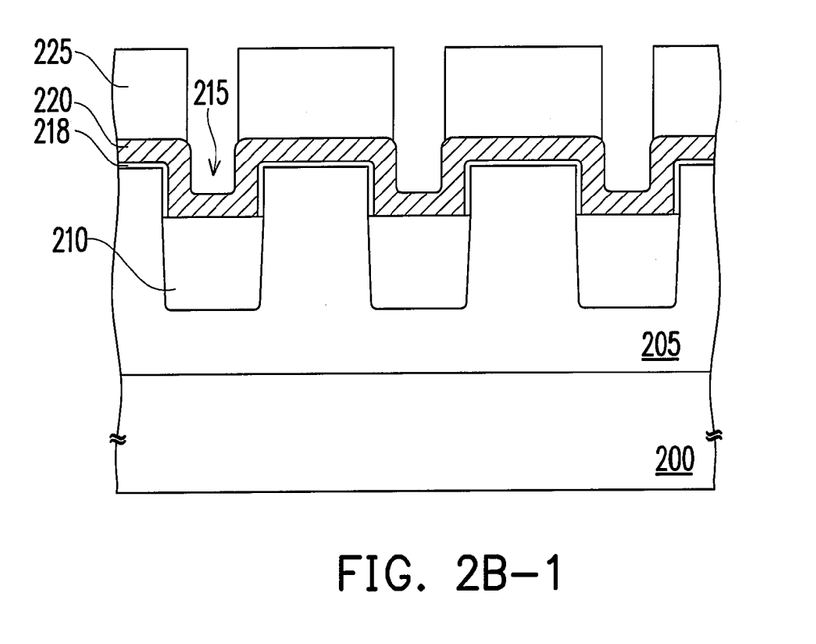
Figure 2B:
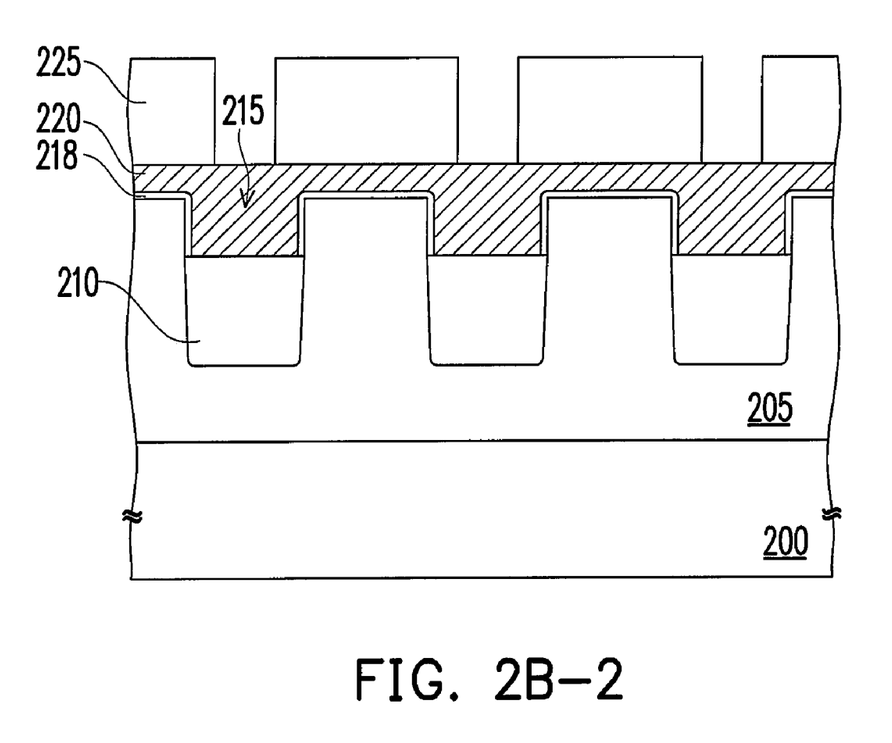
Figure 2C:
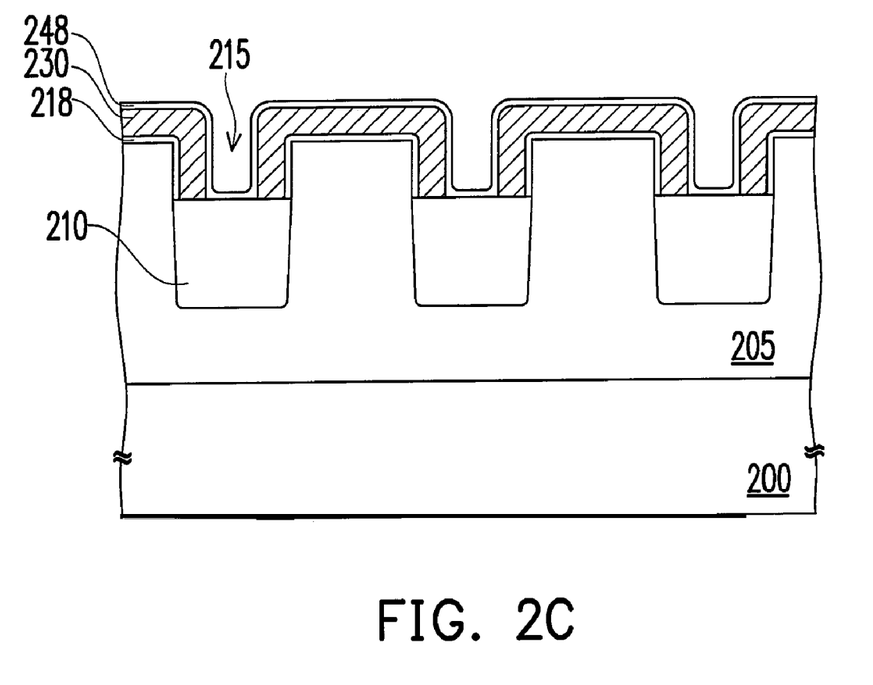
Figure 3A:
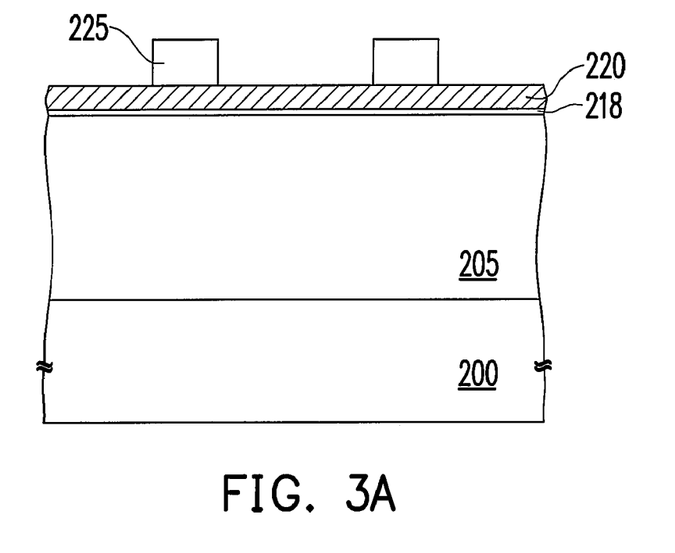
FIGS. 3A~3B are cross-sectional views illustrating the manufacturing process in direction X by cutting FIG. 1B along line II-II'.
Figure 3B:
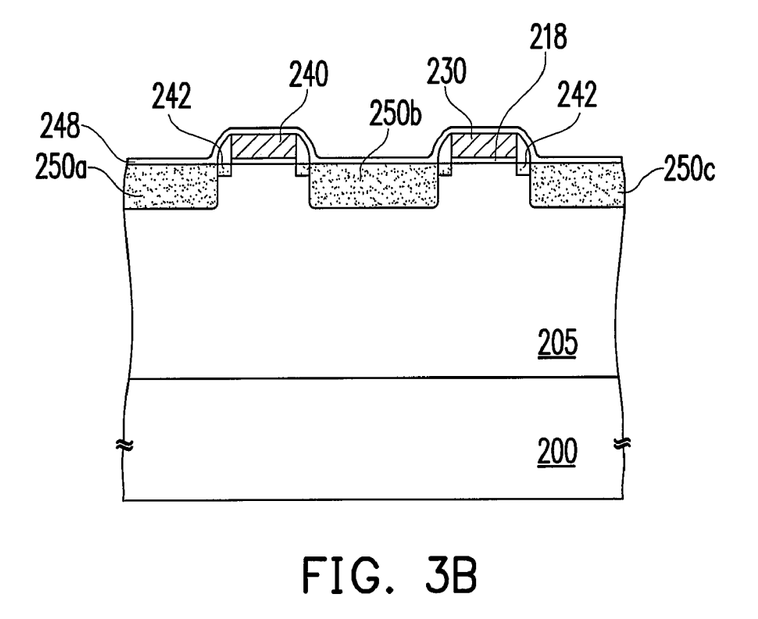

The manufacturing method for the foregoing one time programmable memory will be described below. FIGS. 2A~2C are cross-sectional views illustrating the manufacturing process in direction Y taken along line I-I' in FIG. 1B. FIGS. 3A~3B are cross-sectional views illustrating the manufacturing process in direction X taken along line II-II' in FIG. 1B.

First, referring to FIG. 2A, according to this method, a substrate 200, which is, for example, P-type silicon substrate including a N-well 205, is provided first. A plurality of isolation structures 210 is formed in the substrate 200, and may be included of, for example, shallow trench isolation structures.

Next, a portion of each of the isolation structures 210 is removed for forming the recesses 215 on the isolation structures 210. The method for removing a portion of each of the isolation structures 210 includes, for example, wet or dry etching.

Next, referring to FIG. 2B-1 (thin conductive layer 220), FIG. 2B-2 (thick conductive layer 220), and FIG. 3A, a gate dielectric layer 218 and a conductive material layer 220 are formed on the substrate 200, and the conductive material layer 220 is extended into the recesses 215 and is disposed along the inside wall of the recesses 215 (as shown in FIG. 2B-1) or filled in the recesses 215 (as shown in FIG. 2B-2). Wherein, the material of the gate dielectric layer 218 includes, for example, silicon oxide, and may be formed by, for example, a thermal oxidation or chemical vapor deposition process.

The material of the conductive material layer 220 includes, for example, doped polysilicon, and may be formed by, for example, forming the conductive material layer 220 with ion implantation after forming a non-doped polysilicon layer with chemical vapor deposition; or forming the conductive material layer 220 with chemical vapor deposition by using in situ dopant implantation.

Next, a patterned photoresist layer 225, which, for example, exposes portions of the conductive material layer 220 located on the isolation structures 210, is formed on the conductive material layer 220. The method for forming the patterned photoresist layer 225 includes, for example, forming a positive photoresist layer on the conductive material layer 220 with spin coating method and then developing the pattern after exposure. The patterned photoresist layer 225 covers portions of the conductive material layer 220 (as shown in FIG. 3A).

Next, referring to FIG. 2C and FIG. 3B, the exposed conductive material layer 220 is removed for forming a plurality of floating gates 230 and a plurality of select gates 240. Wherein the floating gates 230 are disposed across the substrate 200 between the isolation structures 210 in blocks and are extended to the sidewalls of the recesses 215. The select gates 240 are disposed across the isolation structures 210 in strips. The method for removing portions of the conductive material layer 220 includes, for example, reactive ion etching process.

Next, dopant implantation process is performed using the floating gates 230 and the select gates 240 as the mask to form the doped regions 250a, 250b, and 250c. The doped regions 250a, 250b, and 250c are, for example, P-type doped regions with boron dopant. A lightly doped region 242 and a spacer 245 can be formed before forming the doped regions 250a, 250b, and 250c. The subsequent process for manufacturing the one time programmable memory should be well-known to those skilled in the art, and therefore will not be described herein.

It should be noted that a mask layer 248 can be selectively formed on the substrate 200 after forming the floating gates and the select gates 240 (or after forming the spacer 245). The material of the mask layer 248 is, for example, silicon nitride, and the formation method thereof is, for example, chemical vapor deposition. The mask layer 248 can be used as the etching stop layer when etching the contact window opening so that the opening of the contact window can be prevented from being etched too deep, which may result in current leakage due to the PN junction between the P-type doped region 250 and the N-well 205.

In the present invention, a simple process is adopted to form the recesses 215 on the isolation structures 210, so that the select gates 240 and the floating gates 230 can be extended to the sidewalls of the recesses 215, accordingly the widths of the channel areas under the select gates 240 and the floating gates 230 and the channel currents are increased, and the number of charges injected into the floating gates 230 is increased.

Accordingly, the reliability of the memory can be increased without increasing the size of the select gates 240 and the floating gates 230, so that the problem of misjudgment due to too small current can be avoided.

Moreover, because of the increase in the widths of the floating gates 230 and the number of charges injected into the floating gates 230, even with the mask layer 248 disposed on the isolation structures 210, the operation of the memory cells is unaffected by the charge trapping effect produced by the mask layer 150 (for example, silicon nitride). Besides, current leakage can also be reduced so that the data storage time of the memory can be prolonged.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A one time programmable memory, comprising:
    a substrate;
    a plurality of isolation structures, disposed in the substrate for defining an active area, each of the isolation structures having a recess so that a top surface of the isolation structure is lower than a top surface of the substrate;
    a first transistor, disposed on the active area, extended to a sidewall of the recess, the gate of the first transistor being a select gate; and
    a second transistor, disposed on the active area, connected to the first transistor in series, the gate of the second transistor being a floating gate, the floating gate being disposed across the active area and extended to the sidewall of the recess.

2. The one time programmable memory as claimed in claim 1, further comprising a gate dielectric layer disposed between the floating gate and the substrate.

3. The one time programmable memory as claimed in claim 1, further comprising a select gate dielectric layer disposed between the select gate and the substrate.

4. The one time programmable memory as claimed in claim 1, wherein the first transistor and the second transistor are P-type transistors.

5. The one time programmable memory as claimed in claim 1, further comprising a mask layer disposed between the isolation structures and the floating gate.

6. The one time programmable memory as claimed in claim 5, wherein the material of the mask layer comprises silicon nitride.

7. The one time programmable memory as claimed in claim 1, wherein the material of the floating gate comprises doped polysilicon.

8. A one time programmable memory, comprising:
    a substrate;
    a plurality of isolation structures, disposed in the substrate, each of the isolation structures having a recess so that a top surface of the isolation structure is lower than a top surface of the substrate;
    a plurality of memory cells, arranged in rows and columns, disposed on the substrate, each of the memory cells comprising:
      a first transistor, the gate of the first transistor being a select gate, the select gate being extended to a sidewall of the recess; and
      a second transistor, the gate of the second transistor being a floating gate, the floating gate being disposed across the substrate between the isolation structures and extended to the sidewall of the recess, wherein,
      a second terminal (the drain) of the first transistor is connected to a first terminal (the source) of the second transistor in series;
    a plurality of select gate lines, disposed across the isolation structures and the substrate, each of the select gate lines being connected to the gates of the first transistors in the same row;
    a plurality of source lines, being respectively coupled to the first terminals of the first transistors in the same row; and
    a plurality of bit lines, being respectively coupled to the second terminals of the second transistors in the same column.

9. The one time programmable memory as claimed in claim 8, further comprising a gate dielectric layer disposed between the floating gate and the substrate.

10. The one time programmable memory as claimed in claim 8, further comprising a select gate dielectric layer disposed between the select gate and the substrate.

11. The one time programmable memory as claimed in claim 8, wherein two adjacent memory cells are disposed in a mirror symmetric arrangement.

12. The one time programmable memory as claimed in claim 8, wherein the first transistor and the second transistor are P-type transistors.

13. The one time programmable memory as claimed in claim 8, further comprising a mask layer disposed between the isolation structures and the floating gate.

14. The one time programmable memory as claimed in claim 13, wherein the material of the mask layer comprises silicon nitride.

15. A manufacturing method of a one time programmable memory, comprising:
    providing a substrate having a plurality of isolation structures formed thereon;
    removing a portion of each of the isolation structures to form a plurality of recesses on the isolation structures;
    forming a gate dielectric layer on the substrate;
    forming a conductive material layer on the substrate, the conductive material layer being extended into the recesses;
    patterning the conductive material layer to form a plurality of floating gates and a plurality of select gates across the substrate and extended to the sidewalls of the recesses; and
    forming a plurality of doped regions in the substrate using the floating gate and the select gate as the mask.

16. The manufacturing method of a one time programmable memory as claimed in claim 15, wherein the step for forming the recesses on the isolation structures comprises wet or dry etching process.

17. The manufacturing method of a one time programmable memory as claimed in claim 15, further comprising a step of forming a mask layer on the substrate after the step of forming the doped regions.

18. The manufacturing method of a one time programmable memory as claimed in claim 17, wherein the material of the mask layer comprises silicon nitride.

19. The manufacturing method of a one time programmable memory as claimed in claim 15, wherein the step of forming the floating gates comprises:
    forming a patterned photoresist layer on the conductive material layer, wherein the patterned photoresist layer exposes portions of the conductive material layer on the isolation structures;
    removing the exposed portions of the conductive material layer; and
    removing the patterned photoresist layer.

20. The manufacturing method of a one time programmable memory as claimed in claim 15, wherein the doped regions are P-type doped regions.

* * * * *